United States Patent
Tamura et al.

(10) Patent No.: US 10,942,236 B2
(45) Date of Patent: Mar. 9, 2021

(54) MAGNETIC RESONANCE IMAGING APPARATUS AND MAGNETIC RESONANCE IMAGING METHOD

(71) Applicant: Canon Medical Systems Corporation, Otawara (JP)

(72) Inventors: Takahiro Tamura, Nasushiobara (JP); Hiroshi Takai, Nasushiobara (JP); Nobuyuki Konuma, Utsunomiya (JP)

(73) Assignee: Canon Medical Systems Corporation, Otawara (JP)

( * ) Notice: Subject to any disclaimer, the term of this patent is extended or adjusted under 35 U.S.C. 154(b) by 172 days.

(21) Appl. No.: 16/147,954

(22) Filed: Oct. 1, 2018

(65) Prior Publication Data

US 2019/0113588 A1   Apr. 18, 2019

(30) Foreign Application Priority Data

Oct. 13, 2017   (JP) .............................. JP2017-199505

(51) Int. Cl.
| | |
|---|---|
| *G01R 33/483* | (2006.01) |
| *G01R 33/56* | (2006.01) |
| *G01R 33/54* | (2006.01) |
| *G01R 33/565* | (2006.01) |
| *G01R 33/567* | (2006.01) |
| *G01R 33/561* | (2006.01) |

(52) U.S. Cl.
CPC ....... *G01R 33/4835* (2013.01); *G01R 33/543* (2013.01); *G01R 33/5602* (2013.01); *G01R 33/5608* (2013.01); *G01R 33/5659* (2013.01); *G01R 33/5673* (2013.01); *G01R 33/5611* (2013.01)

(58) Field of Classification Search
CPC ............ G01R 33/4835; G01R 33/5602; G01R 33/5673; G01R 33/5659; G01R 33/543; G01R 33/5608; G01R 33/5611
USPC ......................................................... 324/309
See application file for complete search history.

(56) References Cited

U.S. PATENT DOCUMENTS

| | | | | |
|---|---|---|---|---|
| 4,602,641 A | * | 7/1986 | Feinberg .............. | A61B 5/0263 324/306 |
| 5,000,182 A | * | 3/1991 | Hinks .................. | A61B 5/0456 600/413 |

(Continued)

FOREIGN PATENT DOCUMENTS

JP   2006-081704   3/2006

OTHER PUBLICATIONS

Wu, W., Poser, B.A., Douaud, G., Frost, R., In, M.H., Speck, O., Koopmans, P.J. and Miller, K.L., 2016. High-resolution diffusion MRI at 7T using a three-dimensional multi-slab acquisition. NeuroImage, 143, pp. 1-14. (Year: 2016).*

(Continued)

*Primary Examiner* — Christopher P McAndrew
(74) *Attorney, Agent, or Firm* — Oblon, McClelland, Maier & Neustadt, L.L.P.

(57) ABSTRACT

A magnetic resonance imaging apparatus according to the present embodiment includes sequence control circuitry. The sequence control circuitry collect first MR data in a first cardiac cycle by excitation of a first region including a first slice, and collects reference data used for phase correction of second MR data on a second slice not included in the first region before and after the collection of the first MR data in the first cardiac cycle.

10 Claims, 8 Drawing Sheets

(56) References Cited

U.S. PATENT DOCUMENTS

| | | | | | |
|---|---|---|---|---|---|
| 5,251,628 | A * | 10/1993 | Foo | | A61B 5/0456 600/413 |
| 5,348,011 | A * | 9/1994 | NessAiver | | A61B 5/0263 600/411 |
| 5,447,155 | A * | 9/1995 | NessAiver | | A61B 5/0263 600/410 |
| 5,729,140 | A * | 3/1998 | Kruger | | G01R 33/56509 324/307 |
| 6,307,369 | B1 * | 10/2001 | Felmlee | | G01R 33/56509 324/307 |
| 7,047,060 | B1 * | 5/2006 | Wu | | G01R 33/563 324/307 |
| 7,917,190 | B2 * | 3/2011 | Mistretta | | G01R 33/4824 600/410 |
| 9,911,062 | B1 * | 3/2018 | Ahmad | | G01R 33/56383 |
| 2003/0225328 | A1 * | 12/2003 | DeMeester | | A61B 5/055 600/419 |
| 2005/0165295 | A1 * | 7/2005 | Li | | G01R 33/56 600/410 |
| 2005/0245812 | A1 * | 11/2005 | Kim | | A61B 5/055 600/410 |
| 2007/0085538 | A1 * | 4/2007 | Hinks | | G01R 33/56341 324/309 |
| 2008/0114236 | A1 * | 5/2008 | Sugiura | | A61B 5/055 600/413 |
| 2011/0263970 | A1 * | 10/2011 | Xu | | G01R 33/4833 600/419 |
| 2013/0274592 | A1 * | 10/2013 | Shin | | G01R 33/4826 600/420 |
| 2014/0159720 | A1 * | 6/2014 | Markl | | G01R 33/4835 324/309 |
| 2014/0225612 | A1 * | 8/2014 | Polimeni | | G01R 33/5611 324/309 |
| 2015/0038829 | A1 * | 2/2015 | Natsuaki | | G01R 33/5673 600/413 |
| 2015/0070015 | A1 * | 3/2015 | Greiser | | G01R 33/36 324/309 |
| 2015/0223703 | A1 * | 8/2015 | Abd-Elmoniem | | A61B 5/7278 600/413 |
| 2015/0238149 | A1 * | 8/2015 | Nitta | | A61B 5/0037 600/413 |
| 2015/0285891 | A1 * | 10/2015 | Dannels | | G01R 33/56554 324/309 |
| 2016/0073910 | A1 * | 3/2016 | Edelman | | A61B 5/0263 600/419 |
| 2016/0125596 | A1 * | 5/2016 | Jo | | G01R 33/56325 382/131 |
| 2016/0252596 | A1 * | 9/2016 | Nielsen | | G01R 33/4835 324/309 |
| 2017/0030990 | A1 * | 2/2017 | Janich | | G01R 33/56563 |
| 2017/0123032 | A1 * | 5/2017 | Jellus | | G01R 33/56545 |
| 2017/0178285 | A1 * | 6/2017 | Jiang | | G06T 7/12 |
| 2017/0248670 | A1 * | 8/2017 | Giri | | G01R 33/4835 |
| 2017/0254869 | A1 * | 9/2017 | Miyazaki | | G01R 33/482 |
| 2018/0203086 | A1 * | 7/2018 | Rehwald | | G01R 33/4818 |

OTHER PUBLICATIONS

Peter Kellman, et al., "Phase-Sensitive Inversion Recovery for Detecting Myocardial Infarction Using Gadolinium-Delayed Hyperenhancement," NIH Public Access, Magn Reson Med. 2002, vol. 47 (2), pp. 1-25.

* cited by examiner

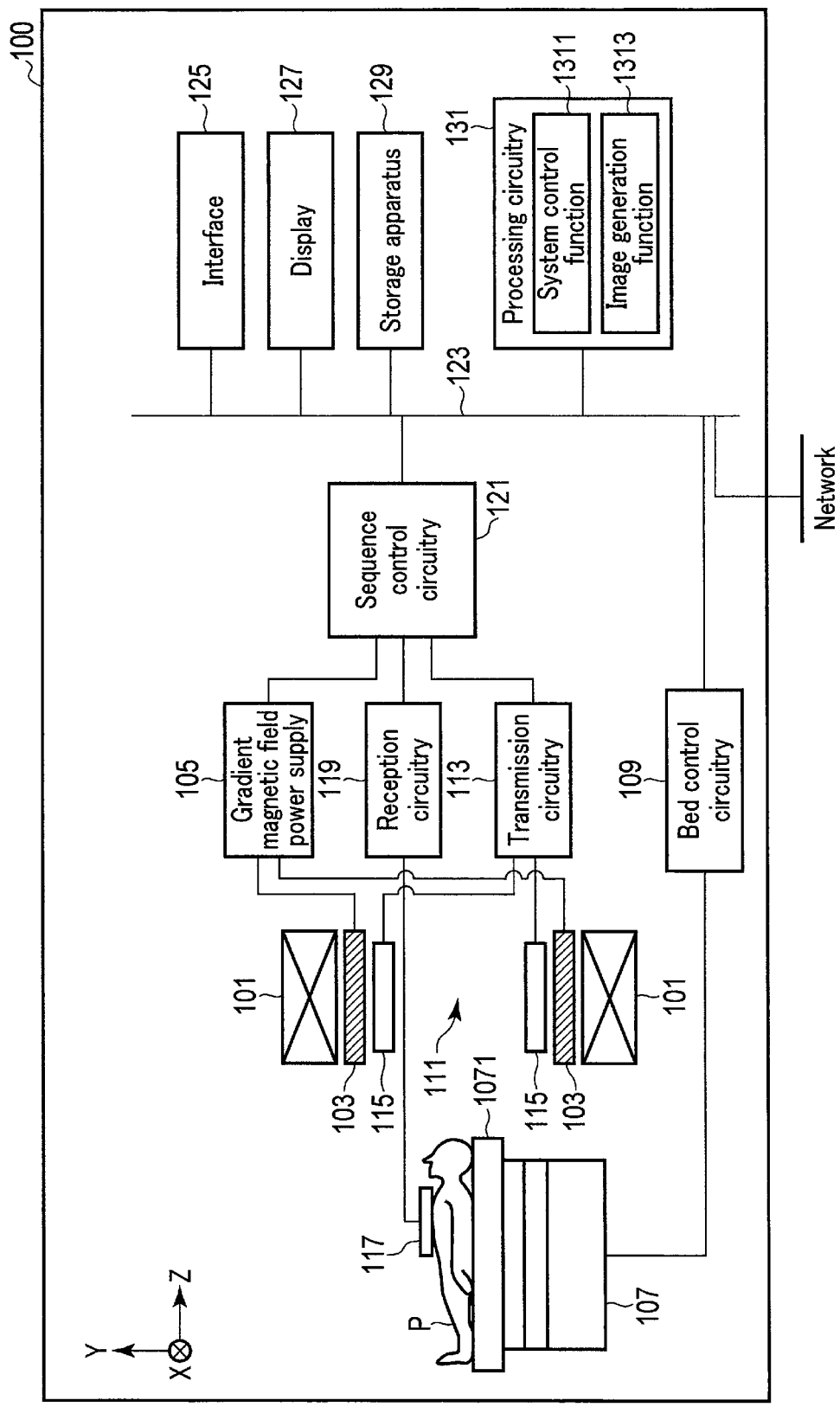
F I G. 1

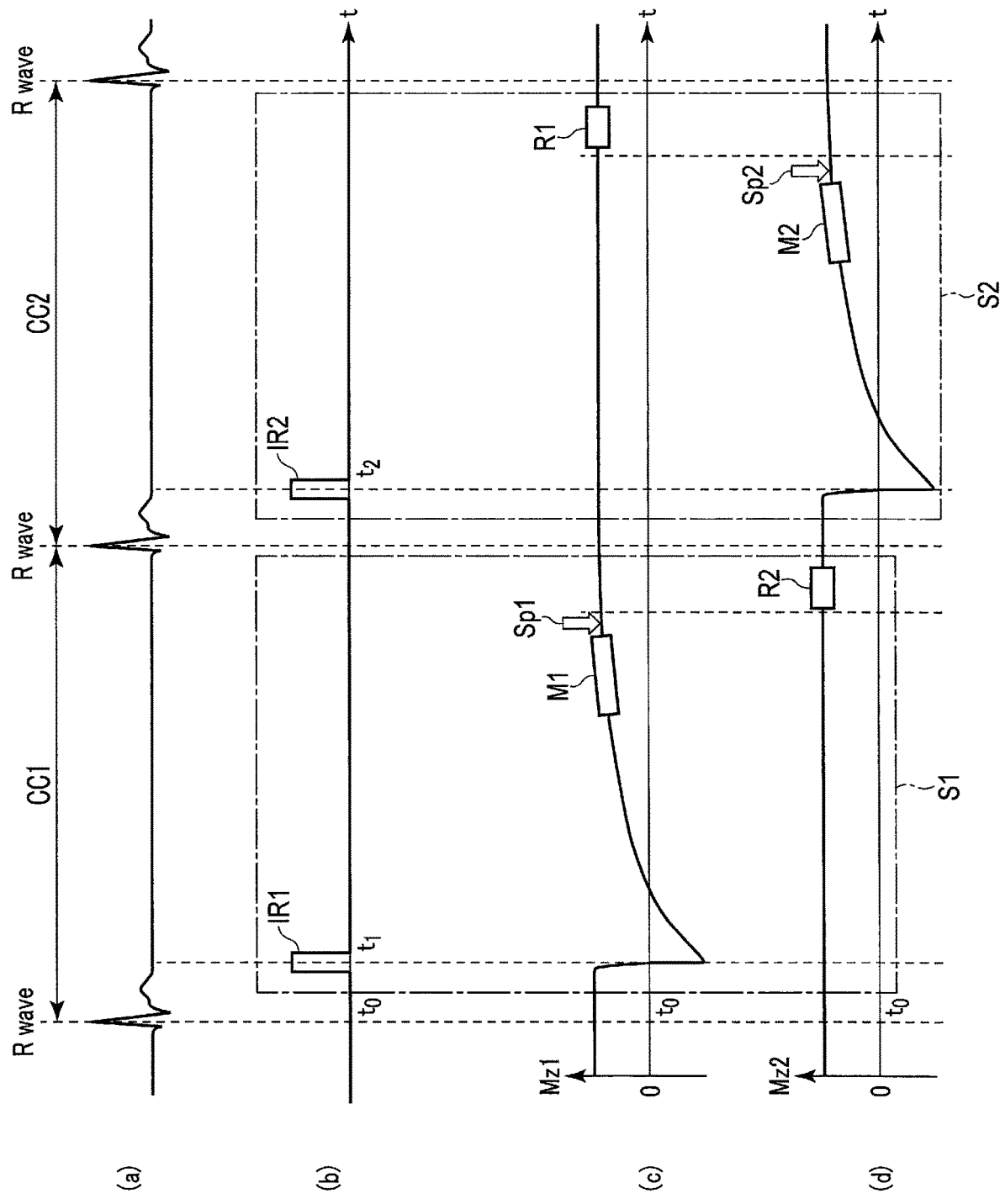
F I G. 2

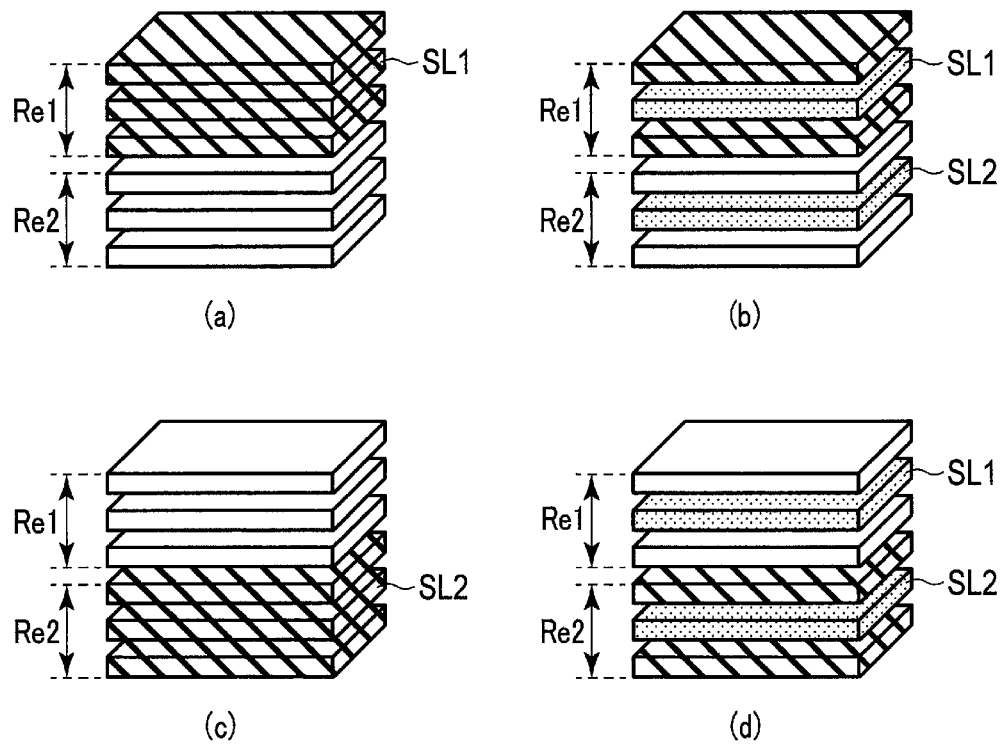
F I G. 4
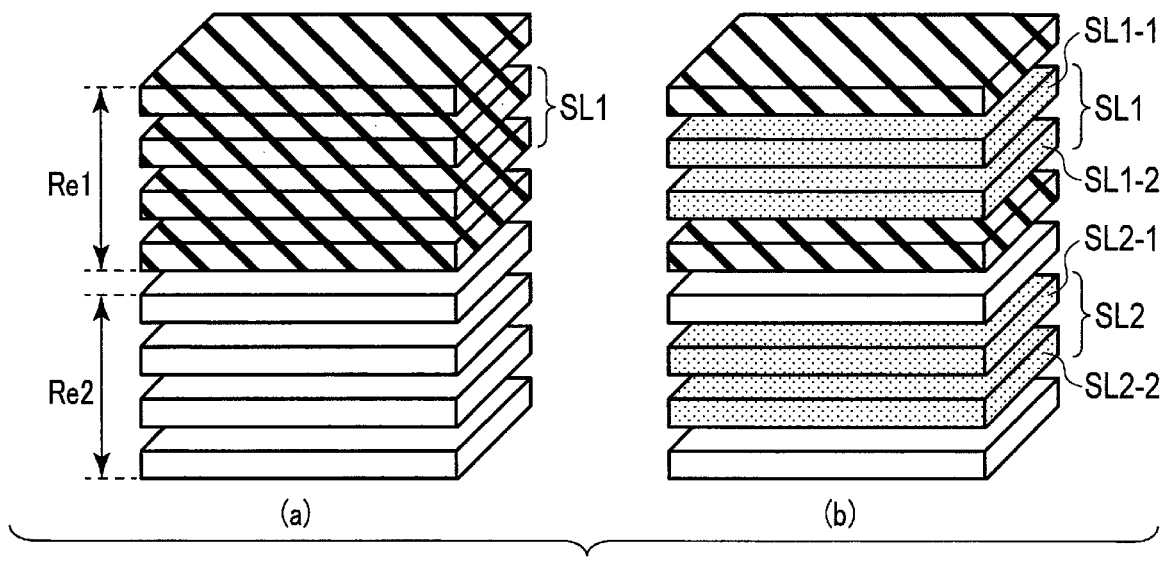
F I G. 5

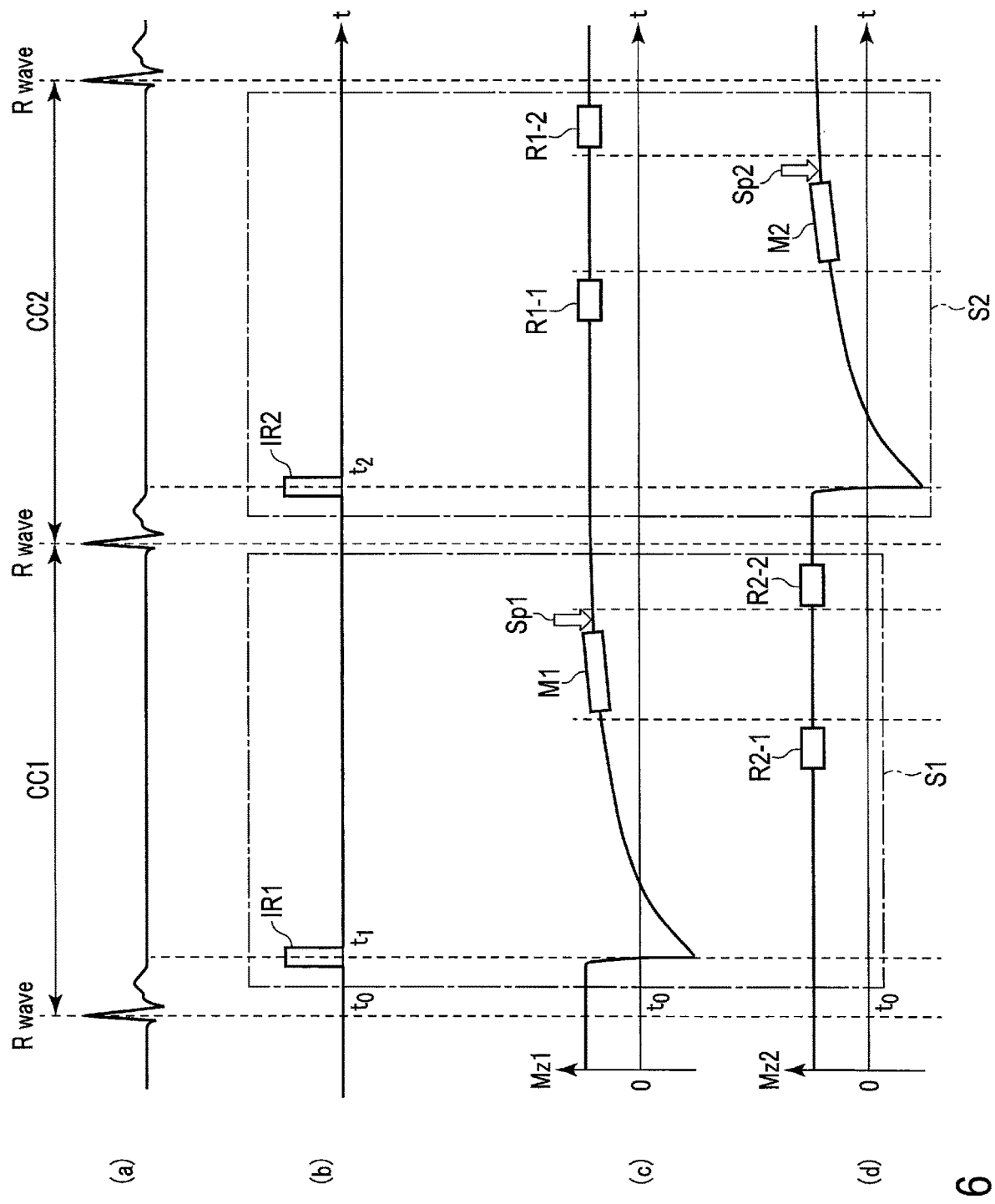
F I G. 6

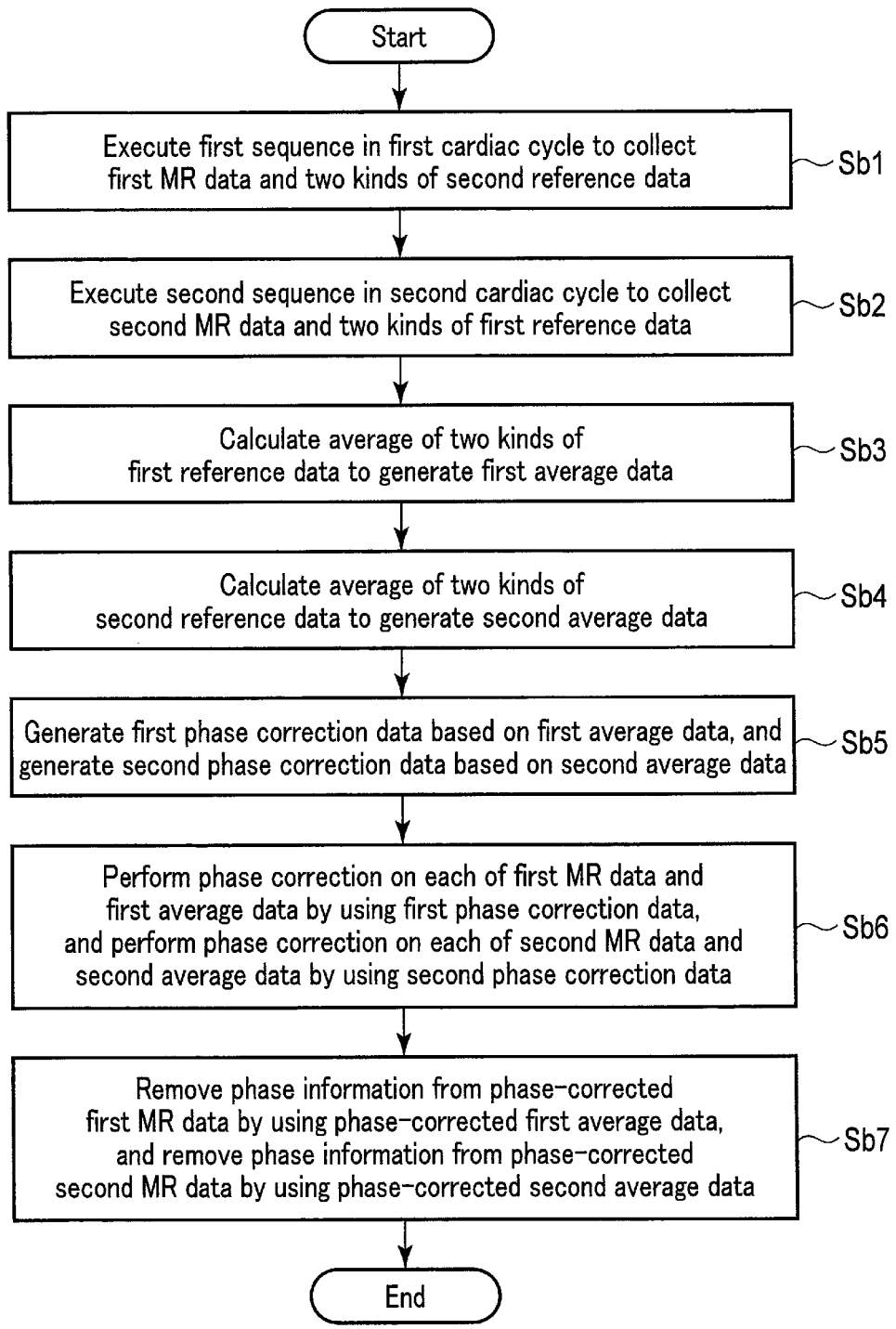
F I G. 7

MAGNETIC RESONANCE IMAGING APPARATUS AND MAGNETIC RESONANCE IMAGING METHOD

CROSS-REFERENCE TO RELATED APPLICATIONS

This application is based upon and claims the benefit of priority from the prior Japanese Patent Application No. 2017-199505, filed Oct. 13, 2017, the entire contents of which are incorporated herein by reference.

FIELD

Embodiments described herein relate to a magnetic resonance imaging apparatus and a magnetic resonance imaging method.

BACKGROUND

A magnetic resonance imaging (hereinafter referred to as MRI) apparatus collects image data in response to the first R wave, and then collects reference data in response to the second R wave when performing imaging by a phase sensitive inversion recovery (hereinafter referred to as PSIR) method. Reference data is corrected after longitudinal magnetization after collection of MR data has approximately recovered to regain the thermal equilibrium state. The MRI apparatus corrects the phase of the MR data by using the reference data, and generates a real image. The PSIR method is often used when the heart of the subject is imaged, and thus adopts breath-holding imaging.

The imaging procedure of a conventional PSIR method requires data collection over two heartbeats to obtain one real image, and has a problem that the imaging time is long. An increase in the imaging time leads to an increase in the breath-holding time, and an increase in the number of breath holds; therefore, there is concern regarding an increase in the stress on the subject, and an effect on the image quality.

BRIEF DESCRIPTION OF THE DRAWINGS

FIG. 1 is a diagram showing a configuration of the magnetic resonance imaging apparatus according to the first embodiment.

FIG. 2 is a diagram showing an example of the sequences of the PSIR method executed in the first embodiment.

FIG. 4 is a diagram showing an example of the region to which various pulses and various sequences in the first sequence and second sequence are applied in the first embodiment.

FIG. 5 is a diagram showing an example of the slices on which multiband imaging is performed in the first collection sequence and the second reference collection sequence in the application of the first embodiment.

FIG. 6 is a diagram showing an example of the sequences of the PSIR method performed in the second embodiment.

FIG. 7 is a diagram showing an example of the steps of the operation in the second embodiment.

DETAILED DESCRIPTION

Figure 3:
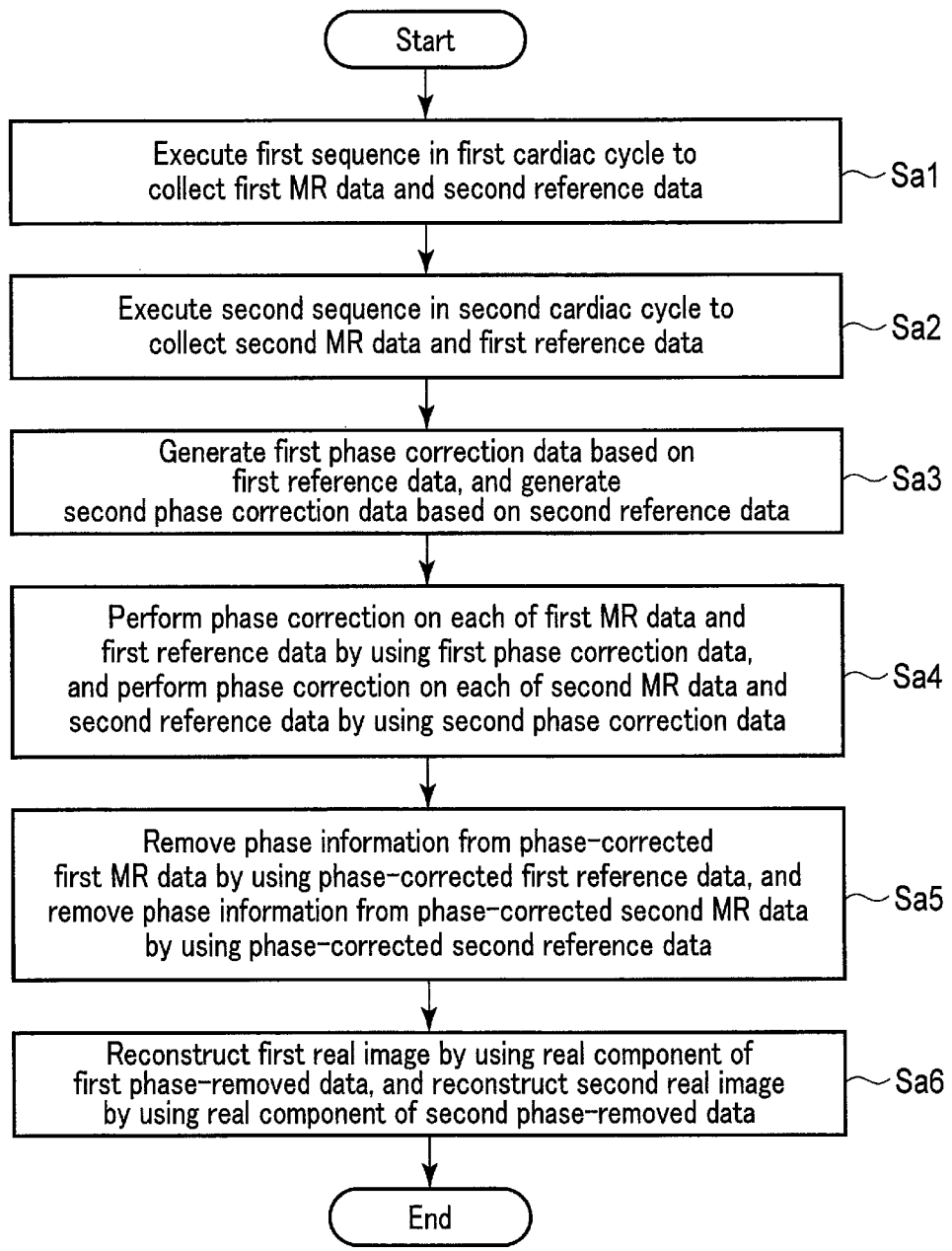
FIG. 3 is a diagram showing an example of the steps of the operation in the first embodiment.

A magnetic resonance imaging apparatus according to the present embodiment includes sequence control circuitry. The sequence control circuitry collects first MR data in a first cardiac cycle by excitation of a first region including a first slice, and collects reference data used for phase correction of second MR data on a second slice not included in the first region before and after collection of the first MR data in the first cardiac cycle.

A purpose is to reduce the imaging time in imaging by the PSIR method.

Hereinafter, a magnetic resonance imaging apparatus according to the embodiments will be described with reference to the accompanying drawings. In the following description, structural elements having approximately the same function and configuration will be assigned with the same reference symbol, and repetitive descriptions will be given only where necessary.

First Embodiment

The general configuration of an MRI apparatus 100 in the present embodiment will be described with reference to FIG. 1. FIG. 1 is a diagram showing a configuration of the MRI apparatus 100 in the present embodiment. As shown in FIG. 1, the MRI apparatus 100 includes a static magnetic field magnet 101, a gradient coil 103, a gradient magnetic field power supply 105, a bed 107, bed control circuitry 109, transmission circuitry (transmitter) 113, a transmitter coil 115, a receiver coil 117, reception circuitry (receiver) 119, sequence control circuitry (sequence controller) 121, a bus 123, an interface (input section) 125, a display 127, a storage apparatus (memory) 129, and processing circuitry (processor) 131. The MRI apparatus 100 may include a hollow cylindrical shim coil between the static magnetic field magnet 101 and the gradient coil 103.

The static magnetic field magnet 101 is a hollow approximately-cylindrical magnet. The static magnetic field magnet 101 is not necessarily approximately-cylindrical, and may be of an open type. The static magnetic field magnet 101 generates a uniform static magnetic field in the inner space. For example, a superconducting magnet or the like is used as the static magnetic field magnet 101.

The gradient coil 103 is a hollow cylindrical coil. The gradient coil 103 is provided inside the static magnetic field magnet 101. The gradient coil 103 is a combination of three coils corresponding to X, Y, and Z-axes orthogonal to one another. The Z-axis direction is the same direction as the direction of the static magnetic field. The Y-axis direction is the vertical direction, and the X-axis direction is perpendicular to the Z-axis and the Y-axis. The three coils in the gradient coil 103 are individually supplied with a current from the gradient magnetic field power supply 105, and generate gradient magnetic fields whose magnetic field intensity changes along the respective X, Y, and Z-axes.

The gradient magnetic fields of the X, Y, and Z-axes generated by the gradient coil 103 form, for example, a slice selection gradient magnetic field, a phase encoding gradient magnetic field, and a frequency encoding gradient magnetic field (also referred to as a readout gradient magnetic field). The slice selection gradient magnetic field is used to determine an imaging slice. The phase encoding gradient magnetic field is used to change the phase of a magnetic resonance (hereinafter referred to as MR) signal in accordance with the spatial position. The frequency encoding gradient magnetic field is used to change the frequency of an MR signal in accordance with the spatial position.

The gradient magnetic field power supply 105 is a power supply device that supplies a current to the gradient coil 103 under the control of the sequence control circuitry 121.

The bed 107 is an apparatus including a top plate 1071 on which the subject P is placed. The bed 107 inserts the top plate 1071 on which the subject P is placed into a bore 111 under the control of the bed control circuitry 109. The bed 107 is installed in an examination room in which the present MRI apparatus 100 is installed in such a manner that, for example, its longitudinal direction is parallel to the central axis of the static magnetic field magnet 101.

The bed control circuitry 109 is circuitry that controls the bed 107, and drives the bed 107 in response to an operator's instruction via the interface 125 to move the top plate 1071 in the longitudinal direction and vertical direction.

The transmission circuitry 113 supplies a radio frequency pulse (RF pulse) corresponding to the Larmor frequency or the like to the transmitter coil 115 under the control of the sequence control circuitry 121.

The transmitter coil 115 is an RF coil provided inside the gradient coil 103. The transmitter coil 115 is supplied with the RF pulse from the transmission circuitry 113 and generates a transmit RF wave corresponding to a radio frequency magnetic field. The transmitter coil 115 is, for example, a whole body coil (WB coil). The WB coil may be used as a transmitter/receiver coil.

The receiver coil 117 is an RF coil provided inside the gradient coil 103. The receiver coil 117 receives an MR signal that the radio frequency magnetic field causes the subject P to emit. The receiver coil 117 outputs the received MR signal to the reception circuitry 119. The receiver coil 117 is, for example, a coil array that has one or more, and typically a plurality of coil elements. FIG. 1 shows the transmitter coil 115 and the receiver coil 117 as separate RF coils; however, the transmitter coil 115 and the receiver coil 117 may be embodied as an integrated transmitter/receiver coil. The transmitter/receiver coil corresponds to the imaging target of the subject P, and is a local transmitter/receiver RF coil such as a head coil.

The reception circuitry 119 generates a digital MR signal that is digitized complex data, based on the MR signal output from the receiver coil 117, under the control of the sequence control circuitry 121. Specifically, the reception circuitry 119 performs various types of signal processing on the MR signal output from the receiver coil 117, and then performs analog-to-digital (A/D) conversion on the data subjected to the various types of signal processing. The reception circuitry 119 samples the A/D-converted data. The reception circuitry 119 thereby generates a digital MR signal (hereinafter referred to as MR data). The reception circuitry 119 outputs the generated MR data to the sequence control circuitry 121.

In accordance with an imaging protocol output from the processing circuitry 131, the sequence control circuitry 121 controls, for example, the gradient magnetic field power supply 105, the transmission circuitry 113, and the reception circuitry 119, and performs imaging on the subject P. The imaging protocol includes various pulse sequences corresponding to the examination. The imaging protocol defines the magnitude of the current supplied from the gradient magnetic field power supply 105 to the gradient coil 103, timing of the supply of the current from the gradient magnetic field power supply 105 to the gradient coil 103, the magnitude of the RF pulse supplied from the transmission circuitry 113 to the transmitter coil 115, timing of the supply of the RF pulse from the transmission circuitry 113 to the transmitter coil 115, and timing of reception of the MR signal at the receiver coil 117, etc.

The bus 123 is a transmission path for transmitting data between the interface 125, the display 127, the storage apparatus 129, and the processing circuitry 131. The bus 123 may be connected via, for example, a network to various physiological signal measuring devices, an external storage apparatus, and various modalities. For example, an electrocardiograph (not shown) is connected to the bus as a physiological signal measuring device.

The interface 125 includes a circuit that receives various instructions and information inputs from the operator. The interface 125 includes a circuit relating to, for example, a pointing device such as a mouse, or an input device such as a keyboard. The circuit included in the interface 125 is not limited to a circuit relating to a physical operational component, such as a mouse or a keyboard. For example, the interface 125 may include an electrical signal processing circuit that receives an electrical signal corresponding to an input operation from an external input device provided separately from the present MRI apparatus 100 and outputs the received electrical signal to various circuits.

The display 127 displays, for example, various MR images generated by an image generation function, and various types of information on imaging and image processing, under the control of a system control function 1311 in the processing circuitry 131. The display 127 is, for example, a display device, such as a CRT display, a liquid crystal display, an organic EL display, an LED display, a plasma display, or any other display or monitor known in the relevant technical field.

The storage apparatus 129 stores, for example, MR data filled in the k space via the image generation function 1313, and image data generated by the image generation function 1313. The storage apparatus 129 stores, for example, various imaging protocols, and an imaging condition including a plurality of imaging parameters defining each imaging protocol. The storage apparatus 129 stores programs corresponding to various functions performed by the processing circuitry 131. The storage apparatus 129 is, for example, a semiconductor memory element, such as a random access memory (RAM) or a flash memory, a hard disk drive, a solid state drive, or an optical disk. The storage apparatus 129 may also be, for example, a drive that performs writing and reading of various types of information on a CD-ROM drive, a DVD drive, or a portable memory medium such as a flash memory.

The processing circuitry 131 includes, as hardware resources, a processor and a memory such as a read-only memory (ROM) and a RAM, which are not shown, and collectively controls the present MRI apparatus 100. The processing circuitry 131 has a system control function 1311, and an image generation function 1313. Various functions performed by the system control function 1311, and the image generation function 1313, are stored in the storage apparatus 129 in the form of a program executable by a computer. The processing circuitry 131 is a processor that reads programs corresponding to the various functions from the storage apparatus 129 and executes them to realize functions corresponding to the programs. In other words, the processing circuitry 131 that has read the programs has, for example, the functions shown in the processing circuitry 131 in FIG. 1.

FIG. 1 illustrates the case where the various functions are realized in a single processing circuit 131; however, the processing circuitry 131 may be constituted by a combination of a plurality of independent processors, and the functions may be realized by the processors executing the programs. In other words, the above-described functions may be configured as programs and executed by a single processing circuit; alternatively, a specific function may be implemented in a dedicated independent program execution circuit. The system control function 1311 and image generation function 1313 of the processing circuitry 131 are examples of a system controller and an image generation section, respectively.

The term "processor" used in the above description means, for example, a circuit such as a central processing unit (CPU), a graphics processing unit (GPU), an application specific integrated circuit (ASIC), or a programmable logic device (e.g., a simple programmable logic device (SPLD), a complex programmable logic device (CPLD), or a field programmable gate array (FPGA)).

The processor realizes various functions by reading and executing programs stored in the storage apparatus 129. The programs may be directly integrated in a circuit of the processor, instead of being stored in the storage apparatus 129. In this case, the processor realizes functions by reading and executing programs integrated in the circuit. Similarly, the bed control circuitry 109, the transmission circuitry 113, the reception circuitry 119, and the sequence control circuitry 121, etc. are constituted by an electronic circuit such as the above-described processor.

The processing circuitry 131 controls the MRI apparatus 100 by the system control function 1311. Specifically, the processing circuitry 131 reads the system control program stored in the storage apparatus 129, loads it in the memory, and controls each circuitry of the present MRI apparatus 100 in accordance with the loaded system control program. For example, the processing circuitry 131 reads an imaging protocol from the storage apparatus 129 by the system control function 1311 based on an imaging condition input by the operator via the interface 125. The processing circuitry 131 may generate the imaging protocol based on the imaging condition. The processing circuitry 131 transmits the imaging protocol to the sequence control circuitry 121, and controls imaging on the subject P.

With the image generation function 1313, the processing circuitry 131 fills MR data in the readout direction of the k space in accordance with the intensity of the readout gradient magnetic field. The processing circuitry 131 performs the Fourier transform on the MR data filled in the k space to generate an MR image. For example, the processing circuitry 131 can generate a magnitude image from complex MR data. The processing circuitry 131 can also generate a phase image by using real part data and imaginary part data of the complex MR data. The processing circuitry 131 outputs an MR image such as a magnitude image or phase image to the display 127 and the storage apparatus 129.

This is the description of the overall configuration of the MRI apparatus 100 according to the present embodiment. Hereinafter, sequences executed in the present MRI apparatus 100 will be described. To specifically describe the PSIR method in the present embodiment, let us assume that the imaging target site on which the sequences executed by the present MRI apparatus 100 are applied is a heart to which a contrast medium has been given. The PSIR method is a delayed enhanced MRI that does not require setting of the inversion time (TI). The PSIR method is an imaging sequence for obtaining an image in which a difference (T1 contrast) between the longitudinal relaxation time of normal myocardium and that of an impaired myocardium is enhanced in a heart to which a contrast medium was given in advance. The impairment of the myocardium is, for example, an infarction. The imaging target site to which the sequences executed by the present MRI apparatus 100 are applied is not limited to the heart, and may be other imaging target sites. The sequence control circuitry 121 executes a first sequence in a first cardiac cycle of two adjacent cardiac cycles, and executes a second sequence in a second cardiac cycle that follows the first cardiac cycle. The imaging protocol including the first sequence and the second sequence is stored in the storage apparatus 129. The first sequence and the second sequence will be described in detail later.

FIG. 2 is a diagram showing an example of the sequences of the PSIR method executed in the present embodiment. (a) in FIG. 2 shows a waveform of an electrocardiogram (ECG) of the subject P obtained by an electrocardiograph (hereinafter referred to as an electrocardiographic waveform). CC1 in (a) of FIG. 2 indicates the first cardiac cycle between two adjacent R waves. CC2 in (a) of FIG. 2 indicates the second cardiac cycle that follows the first cardiac cycle CC1. The sequence control circuitry 121 executes a first sequence S1 in the first cardiac cycle CC1, and executes a second sequence S2 in the second cardiac cycle.

(b) in FIG. 2 indicates the timing of application of an inversion recovery pulse (hereinafter referred to as an IR pulse) to the subject P. The IR pulse is a pulse that inverts nuclear magnetization in the region to which the IR pulse is applied. The timing of application of the IR pulse is set, for example, as follows: First, a period from when longitudinal magnetization of a normal myocardium is inverted by an IR pulse to when longitudinal magnetization of the normal myocardium becomes zero (hereinafter referred to as a recovery period) is set. Then, a time phase of the cardiac cycle at a point in time that is the recovery period before the starting time of the diastolic phase (hereinafter referred to as a specific time phase) is identified. The time from an R wave to the specific time phase in one cardiac cycle (hereinafter referred to as a predetermined time) is determined. The predetermined time is stored in the storage apparatus 129. The timing of application of the IR pulse is set to the predetermined time after an R wave in each of a plurality of cardiac cycles.

(c) in FIG. 2 shows a temporal change of longitudinal magnetization Mz1 in a first slice.

(d) in FIG. 2 shows a temporal change of longitudinal magnetization Mz2 in a second slice apart from a first region including the first slice and thicker than the first slice. For example, when the heart of the subject P is divided into two regions, i.e., a region including a cardiac base and a region including a cardiac apex, the first region corresponds to, for example, the region including the cardiac base. The region including the cardiac apex corresponds to a second region including the second slice and thicker than the second slice.

Hereinafter, the first sequence S1 executed by the sequence control circuitry 121 in the first cardiac cycle CC1 will be described. The first sequence S1 includes a first IR pulse IR1, a first collection sequence M1, a first spoiler pulse Sp1, and a second reference collection sequence R2.

The first IR pulse IR1 is an RF pulse that inverts nuclear magnetization in the first region. The first IR pulse IR1 is applied to the first region at time $t_1$, which is the predetermined time after an R wave in the first cardiac cycle CC1.

The first collection sequence M1 is a sequence for collecting MR data for an image relating to the first slice (hereinafter referred to as first MR data) after application of the first IR pulse IR1 in the first cardiac cycle CC1. As a sequence executed in the first collection sequence M1, for example, a gradient echo that performs imaging with a short repetition time (TR) and a small flip angle is used. The gradient echo is for example, a 2D segmented fast low angle shot (FLASH).

The first spoiler pulse Sp1 is a spoiler pulse that recovers nuclear magnetization in the first region. After execution of the first collection sequence M1 in the first cardiac cycle CC1, the first spoiler pulse Sp1 is applied to the first region. The first spoiler pulse Sp1 is, for example, a gradient magnetic field spoiler for gradient spoiling. The first spoiler pulse Sp1 is not limited to the gradient magnetic field spoiler, and may be, for example, an RF pulse that forcibly recovers longitudinal magnetization Mz (hereinafter referred to as an RF spoiler). Alternatively, both a gradient magnetic field spoiler and RF spoiler may be used as the first spoiler pulse Sp1.

The second reference collection sequence R2 is a sequence for collecting reference data in the second slice (hereinafter referred to as second reference data) after application of the first spoiler pulse Sp1 in the first cardiac cycle CC1. The second reference data is used for phase correction of MR data for an image corrected by the second collection sequence M2 to be described later (hereinafter referred to as second MR data) and the second reference data. The phase correction will be described in detail later. The second reference collection sequence R2 is the same as the first collection sequence M1 other than the flip angle, which is smaller than that in the first collection sequence M1, the collection timing, and the slice position.

Hereinafter, the second sequence S2 executed by the sequence control circuitry 121 in the second cardiac cycle CC2 will be described. The second sequence S2 includes a second IR pulse IR2, a second collection sequence M2, a second spoiler pulse Sp2, and a first reference collection sequence R1.

The second IR pulse IR2 is an RF pulse that inverts nuclear magnetization in the second region. The second IR pulse IR2 is applied to the second region at time $t_2$, which is the predetermined time after an R wave in the second cardiac cycle CC2.

The second collection sequence. M2 is a sequence for collecting second MR data on the second slice after application of the second IR pulse IR2 in the second cardiac cycle CC2. The second collection sequence M2 is the same as the first collection sequence M1 other than the cardiac cycle and the slice position.

The second spoiler pulse Sp2 is a spoiler pulse that recovers nuclear magnetization in the second region. After execution of the second collection sequence M2 in the second cardiac cycle CC2, the second spoiler pulse Sp2 is applied to the second region. The second spoiler pulse Sp2 is the same as the first spoiler pulse Sp1 other than the cardiac cycle and the application region.

The first reference collection sequence R1 is a sequence for collecting reference data from the first slice (hereinafter referred to as first reference data) after application of the second spoiler pulse Sp2 in the second cardiac cycle CC2. The first reference data is used for phase correction of the first MR data and the first reference data. The first reference collection sequence R1 is the same as the second reference collection sequence R2 other than the cardiac cycle and the slice position.

(Operation)

The steps of the operation in the present embodiment will be described with reference to FIGS. 3 and 4. FIG. 3 is a diagram showing an example of the steps of the operation in the present embodiment. FIG. 4 is a diagram showing an example of the region to which various pulses and various sequences in the first sequence S1 and second sequence S2 are applied. In (a) of FIG. 4, the first region Re1 to which the first IR pulse IR1 is applied is indicated by hatching. (b) in FIG. 4 shows the first slice SL1 from which the first MR data is collected, and the second slice SL2 from which the second reference data is collected. In (c) of FIG. 4, the second region Re2 to which the second IR pulse IR2 is applied is indicated by hatching. (d) in FIG. 4 shows the first slice SL1 from which the first reference data is collected, and the second slice SL2 from which the second MR data is collected.

(Step Sa1)

The sequence control circuitry 121 executes the first sequence S1 to collect first MR data and second reference data in the first cardiac cycle CC1. Specifically, as shown in FIGS. 2 and 4, the sequence control circuitry 121 controls the transmission circuitry 113 to apply the first IR pulse IR1 to the first region Re1 at time $t_1$, which is the predetermined time after the detection time ($t_0$) of the first R wave in the first cardiac cycle CC1. As shown in (a) of FIG. 4, the first IR pulse IR1 is not a non-selective IR pulse, but a selective IR pulse that is selectively applied to the first slice SL1. As shown in (a) of FIG. 4, the first region Re1 is thicker than the first slice SL1 to be imaged at the imaging target site.

As shown in FIGS. 2 and 4, the sequence control circuitry 121 executes the first collection sequence M1 in an approximate diastolic phase of the first cardiac cycle CC1, and collects first MR data on the first slice SL1. After collection of the first MR data, the sequence control circuitry 121 controls the transmission circuitry 113 and/or the gradient magnetic field power supply 105 to apply the first spoiler pulse Sp1 to the first region Re1. After application of the first spoiler pulse Sp1, the sequence control circuitry 121 executes the second reference collection sequence R2, and collects second reference data on the second slice SL2. The sequence control circuitry 121 outputs the first MR data and the second reference data to the processing circuitry 131.

(Step Sa2)

The sequence control circuitry 121 executes the second sequence S2 to collect second MR data and first reference data in the second cardiac cycle CC2. Specifically, as shown in FIGS. 2 and 4, the sequence control circuitry 121 controls the transmission circuitry 113 to apply the second IR pulse IR2 to the second region Re2 at time $t_2$, which is the predetermined time after the detection time of the first R wave in the second cardiac cycle CC2 (or the last R wave in the first cardiac cycle CC1). Like the first IR pulse IR1, the second IR pulse IR2 is not a non-selective IR pulse, but a selective pulse that is selectively applied to the second slice SL2, as shown in (c) of FIG. 4. As shown in (c) of FIG. 4, the second region Re2 is thicker than the second slice SL2 to be imaged at the imaging target site.

As shown in (d) of FIG. 2 and (d) of FIG. 4, the sequence control circuitry 121 executes the second collection sequence M2 in an approximate diastolic phase of the second cardiac cycle CC2, and collects second MR data on the second slice SL2. After collection of the second MR data, the sequence control circuitry 121 controls the transmission circuitry 113 and/or the gradient magnetic field power supply 105 to apply the second spoiler pulse Sp2 to the second region Re2. After application of the second spoiler pulse Sp2, the sequence control circuitry 121 executes the first reference collection sequence R1, and collects first reference data on the first slice SL1. The sequence control circuitry 121 outputs the second MR data and the first reference data to the processing circuitry 131.

(Step Sa3)

With the image generation function 1313, the processing circuitry 131 generates first phase correction data based on the first reference data. The processing circuitry 131 generates second phase correction data based on the second reference data. The first phase correction data corresponds to a weight for canceling a phase distortion (phase error) caused by, for example, the transmitter coil 117 regarding the first slice SL1. The second phase correction data corresponds to a weight for canceling a phase distortion (phase error) caused by, for example, the transmitter coil 117 regarding the second slice SL2. Specifically, the processing circuitry 131 generates the first phase correction data by using the first reference data, the complex conjugate of the first reference data, and noise variance measured in advance. The processing circuitry 131 generates the second phase correction data by using the second reference data, the complex conjugate of the second reference data, and the aforementioned noise variance.

(Step Sa4)

With the image generation function 1313, the processing circuitry 131 performs phase correction on each of the first MR data and the first reference data by using the first phase correction data. The processing circuitry 131 performs phase correction on each of the second MR data and the second reference data by using the second phase correction data. The phase correction in the processing of this step cancels the phase error in each of the first MR data, the second MR data, the first reference data, and the second reference data.

(Step Sa5)

With the image generation function 1313, the processing circuitry 131 removes phase information from the phase-corrected first MR data by using the phase-corrected first reference data. The processing circuitry 131 removes phase information from the phase-corrected second MR data by using the phase-corrected second reference data. Specifically, the processing circuitry 131 calculates first phase information by using the real component and imaginary component of the phase-corrected first reference data. Then, the processing circuitry 131 removes the first phase information from the phase-corrected first MR data. The polarity of the signal of the first MR data is maintained in the real component of data obtained by removing the first phase information from the phase-corrected first MR data (hereinafter referred to as first phase-removed data). The processing circuitry 131 calculates second phase information by using the real component and imaginary component of the phase-corrected second reference data. Then, the processing circuitry 131 removes the second phase information from the phase-corrected second MR data. The polarity of the signal of the second MR data is maintained in the real component of data obtained by removing the second phase information from the phase-corrected second MR data (hereinafter referred to as second phase-removed data).

(Step Sa6)

With the image generation function 1313, the processing circuitry 131 reconstructs a first real image by using the real component of the first phase-removed data. The processing circuitry 131 reconstructs a second real image by using the real component of the second phase-removed data. In this step, the processing circuitry 131 may perform correction to address uneven sensitivity of the receiver coil 117 on the first real image and the second real image by using a sensitivity map of the receiver coil 117.

The processing circuitry 131 outputs the first real image and the second real image to, for example, the display 127 and the storage apparatus 129. The display 127 displays the first real image and the second real image. The storage apparatus 129 stores the first real image and the second real image. The processing from step Sa1 to step Sa6 may be repeated as appropriate. The processing from step Sa1 to step Sa6 may be repeated as appropriate until a plurality of real images corresponding to a plurality of slices required by the operator can be obtained at the imaging target site.

The above-described configuration has the following advantages:

The MRI apparatus 100 according to the present embodiment can execute, in a first cardiac cycle CC1, a first sequence S1 for applying a first IR pulse IR1 to a first region Re1 that includes a first slice SL1 and is thicker than the first slice SL1, collecting first MR data on the first slice SL1 after application of the first IR pulse IR1, applying a first spoiler pulse Sp1 for recovery of nuclear magnetization to the first region Re1 after collection of the first MR data, and collecting second reference data for second MR data on a second slice SL2 apart from the first region Re1 after application of the first spoiler pulse Sp1. The present MRI apparatus 100 can also execute, in a second cardiac cycle CC2, a second sequence S2 for applying a second IR pulse IR2 to a second region Re2 that includes the second slice SL2 and is thicker than the second slice SL2, collecting the second MR data after application of the second IR pulse IR2 on the second region Re2, applying a second spoiler pulse Sp2 to the second region Re2 after collection of the second MR data, and collecting first reference data for the first MR data after application of the second spoiler pulse Sp2.

As described above, the MRI apparatus 100 in the present embodiment can reduce the imaging time in imaging by the PSIR method. In addition, the present MRI apparatus 100 can apply the first IR pulse IR1 to the first region Re1, and apply the second IR pulse IR2 to the second region Re2, and thus can reliably apply IR pulses to the slices to be imaged. Therefore, when the imaging target site moves in the subject P during imaging, the present MRI apparatus 100 can avoid extension of the imaging time caused by a deviation of the application position of an IR pulse, in comparison to the case where an IR pulse is selectively applied to a slice to be imaged.

(Application)

The application differs from the first embodiment in that multi-slice simultaneous imaging (hereinafter referred to as multiband imaging) is performed in the first and second collection sequences M1 and M2, and the first and second reference collection sequences R1 and R2. Hereinafter, the multiband imaging will be described with reference to FIG. 5. FIG. 5 is a diagram showing an example of the slices on which multiband imaging is performed in the first collection sequence M1, and the second reference collection sequence R2.

In (a) of FIG. 5, the first region Re1 to which the first IR pulse IR1 is applied is indicated by hatching. (b) in FIG. 5 shows a plurality of slices SL1-1 and SL1-2 included in the first slice SL1 from which first MR data is collected, and a plurality of slices SL2-1 and SL2-2 included in the second slice SL2 from which second reference data is collected.

Hereinafter, to provide specific descriptions, let us assume that the first region Re1 and the second region Re2 each include four slices as shown in FIG. 5. Let us also assume that the first slice SL1 and the second slice SL2 each have a thickness corresponding to two slices. The number of slices included in each of the first slice SL1 and the second slice SL2 is not limited to two as shown in FIG. 5, and may be three or larger. The number of slices included in each of the first region Re1 and the second region Re2 is not limited to four, and may be larger.

The sequence control circuitry 121 sets the thicknesses of the first and second slices SL1 and SL2 on which multiband imaging is performed, for example, in accordance with the operator's instructions via the interface 125. The set thicknesses are those including a plurality of slices SL1-1 and SL1-2, and SL2-1 and SL2-2. The thicknesses for multiband imaging may be stored in the storage apparatus 129 in association with the first and second sequences S1 and S2.

The sequence control circuitry 121 determines multi-frequency bands of RF pulses used in the first and second collection sequences M1 and M2 and the first and second reference collection sequences R1 and R2, based on the set thicknesses each corresponding to a plurality of slices, the positions of a plurality of slices in the bore 111, and the slice selection gradient magnetic field. The multi-frequency bands of RF pulses for multiband imaging may be stored in the storage apparatus 129 in association with the first and second sequences S1 and S2 by default.

The sequence control circuitry 121 executes the first collection sequence M1 to apply an RF pulse in a multi-frequency band to a first slice SL1 including slice SL1-1 and slice SL1-2. The sequence control circuitry 121 executes the second reference collection sequence R2 to apply an RF pulse in a multi-frequency band to a second slice SL2 including slice SL2-1 and slice SL2-2.

The sequence control circuitry 121 executes the second collection sequence M2 to apply an RF pulse in a multi-frequency band to the second slice SL2 including slice SL2-1 and slice SL2-2. The sequence control circuitry 121 executes the first reference collection sequence R1 to apply an RF pulse in a multi-frequency band to the first slice SL1 including slice SL1-1 and slice SL1-2.

With the image generation function 1313, the processing circuitry 131 divides the first MR data into MR data corresponding to slice SL1-1 and MR data corresponding to slice SL1-2 by using the sensitivity map of the receiver coil 117. The processing circuitry 131 divides the second reference data into reference data corresponding to slice SL2-1 and reference data corresponding to slice SL2-2 by using the sensitivity map of the receiver coil 117. The processing circuitry 131 divides the second MR data into MR data corresponding to slice SL2-1 and MR data corresponding to slice SL2-2 by using the sensitivity map of the receiver coil 117. The processing circuitry 131 divides the first reference data into reference data corresponding to slice SL1-1 and reference data corresponding to slice SL1-2 by using the sensitivity map of the receiver coil 117. The processing circuitry 131 performs the processing from step Sa3 to step Sa6 in FIG. 3 on each of slice SL1-1, slice SL1-2, slice SL2-2, and slice SL2-2, and generates a real image of each of slice SL1-1, slice SL1-2, slice SL2-2, and slice SL2-2.

The above-described configuration has the following advantages in addition to the advantages of the first embodiment:

According to the MRI apparatus 100 according to this application, the first slice SL1 has a thickness corresponding to a plurality of slices, the second slice SL2 has a thickness corresponding to a plurality of slices, an RF pulse in a multi-frequency band corresponding to the first slice SL1 can be applied to the first slice SL1 when first MR data is collected, and when first reference data is collected, an RF pulse in a multi-frequency band corresponding to the second slice SL2 can be applied to the second slice SL2 when second MR data is collected and when second reference data is collected. Accordingly, the MRI apparatus 100 in this application can simultaneously image multiple slices in imaging by the PSIR method, and can further reduce the imaging time in comparison with the MRI apparatus in the first embodiment.

Second Embodiment

The second embodiment differs from the first embodiment and the application in that second reference data is further collected from the second slice SL2 immediately before collection of the first MR data in the first cardiac cycle CC1, and first reference data is further collected from the first slice SL1 immediately before collection of the second MR data in the second cardiac cycle CC2. The second embodiment further differs from the first embodiment and the application in that the first IR pulse IR1 and the first spoiler pulse Sp1 are selectively applied to the first slice SL1, and the second IR pulse IR2 and the second spoiler pulse Sp2 are selectively applied to the second slice SL2.

For example, the sequence control circuitry 121 applies the first IR pulse IR1 and the first spoiler pulse Sp1 to the first region Re1 with a gradient magnetic field that selects the first region Re1 including the first slice SL1. The sequence control circuitry 121 also applies the second IR pulse IR2 and the second spoiler pulse Sp2 to the second region Re2 with a gradient magnetic field that selects the second region Re2 including the second slice SL2.

FIG. 6 is a diagram showing an example of the sequences of the PSIR method executed in the present embodiment. (a) in FIG. 6 shows an electrocardiographic waveform of the subject P obtained by an electrocardiograph. (b) in FIG. 6 shows the timing of application of the first IR pulse IR1 and the second IR pulse IR2 to the subject P. (c) in FIG. 6 shows a temporal change of longitudinal magnetization Mz1 in the first slice SL1. (d) in FIG. 6 shows a temporal change of longitudinal magnetization Mz2 in the second slice SL2.

As shown in FIG. 6, the first sequence S1 further includes a reference collection sequence R2-1 for collecting second reference data from the second slice SL2 immediately before collection of the first MR data. As shown in FIG. 6, the second sequence S2 further includes a reference collection sequence R1-1 for collecting first reference data from the first slice SL1 immediately before collection of the second MR data. The reference collection sequence R2-2 in the present embodiment corresponds to the second reference collection sequence R2 in the first embodiment. The reference collection sequence R1-2 in the present embodiment corresponds to the first reference collection sequence R1 in the first embodiment.

The reference collection sequence R2-2 differs from the reference collection sequence R2-1 in terms of the collection timing in the first cardiac cycle CC1. The starting time of the reference collection sequence R2-1 in the first sequence S1 is a cardiac phase at a time the execution period of the reference collection sequence R2-2 before the starting time of the first collection sequence M1, and is associated with the first R wave in the first cardiac cycle CC1. The starting time of the reference collection sequence R2-1 is stored in the storage apparatus 129 together with the first sequence S1.

The reference collection sequence R1-2 differs from the reference collection sequence R1-1 in terms of the collection timing in the second cardiac cycle CC2. The starting time of the reference collection sequence R1-1 in the second sequence S2 is a cardiac phase at a time the execution period of the reference collection sequence R1-2 before the starting time of the second collection sequence M2, and is associated with the first R wave in the second cardiac cycle CC2. The starting time of the reference collection sequence R1-1 is stored in the storage apparatus 129 together with the second sequence S2.

(Operation)

The steps of the operation in the present embodiment will be described with reference to FIGS. 6 and 7. FIG. 7 is a diagram showing an example of the steps of the operation in the present embodiment. In the description of the operation, the processing different from that in the first embodiment will be described.

(Step Sb1)

The sequence control circuitry 121 executes the first sequence S1 to collect first MR data and two kinds of second reference data in the first cardiac cycle CC1. For example, the sequence control circuitry 121 collects first MR data in the first cardiac cycle CC1 by excitation of the first region Re1 including the first slice SL1, and collects reference data (second reference data) used for phase correction of second MR data on the second slice SL2 not included in the first region Re1 before and after collection of the first MR data in the same first cardiac cycle CC1. Specifically, as shown in (b) of FIG. 6, the sequence control circuitry 121 controls the transmission circuitry 113 to apply the first IR pulse IR1 to the first slice SL1 at time $t_1$, in response to the first R wave in the first cardiac cycle CC1. The first IR pulse IR1 in the present embodiment is a selective IR pulse that is selectively applied to the first slice SL1.

The sequence control circuitry 121 executes the reference collection sequence R2-1 in response to the R wave to collect first-second reference data in the first cardiac cycle CC1. The sequence control circuitry 121 collects first MR data after collection of the first-second reference data. To apply the first spoiler pulse Sp1 to the first slice SL1 after collection of the first MR data, the sequence control circuitry 121 controls the transmission circuitry 113 and/or the gradient magnetic field power supply 105. The sequence control circuitry 121 executes the reference collection sequence R2-2 after application of the first spoiler pulse Sp1 to collect second-second reference data. The sequence control circuitry 121 outputs the two kinds of collected second reference data to the processing circuitry 131.

(Step Sb2)

The sequence control circuitry 121 executes the second sequence S2 to collect second MR data and two kinds of first reference data in the second cardiac cycle CC2. For example, the sequence control circuitry 121 collects second MR data in the second cardiac cycle CC2 that is different from the first cardiac cycle CC1 by excitation of the second region Re2 including the second slice SL2, and Specifically, as shown in (b) of FIG. 6, the sequence control circuitry 121 controls the transmission circuitry 113 to apply the second IR pulse IR2 to the second slice SL2 at time $t_2$, in response to the first R wave in the second cardiac cycle CC2 (or the last R wave in the first cardiac cycle CC1). The second IR pulse IR2 in the present embodiment is a selective IR pulse that is selectively applied to the second slice SL2.

The sequence control circuitry 121 executes the reference collection sequence R1-1 in response to the R wave to collect first-first reference data in the second cardiac cycle CC2. The sequence control circuitry 121 collects second MR data after collection of the first-first reference data. To apply the second spoiler pulse Sp2 to the second slice SL2 after collection of the second MR data, the sequence control circuitry 121 controls the transmission circuitry 113 and/or the gradient magnetic field power supply 105. The sequence control circuitry 121 executes the reference collection sequence R1-2 after application of the second spoiler pulse Sp2 to collect second-first reference data. The sequence control circuitry 121 outputs the two kinds of collected first reference data to the processing circuitry 131.

(Step Sb3)

With the image generation function 1313, the processing circuitry 131 performs phase correction on the second MR data obtained in the second cardiac cycle CC2 by using the second reference data. Specifically, with the image generation function 1313, the processing circuitry 131 calculates the average of the two kinds of first reference data on the first slice SL1 to generate first average data. The first average data is, for example, data obtained by averaging the phase components of the two kinds of first reference data. The first average data may be generated by weighted-summing the intensity components of the two kinds of first reference data.

(Step Sb4)

With the image generation function 1313, the processing circuitry 131 calculates the average of the two kinds of second reference data on the second slice SL2 to generate second average data. The second average data is, for example, data obtained by averaging the phase components of the two kinds of second reference data. The second average data may be generated by weighted-summing the intensity components of the two kinds of second reference data.

(Step Sb5)

With the image generation function 1313, the processing circuitry 131 generates first phase correction data based on the first average data. The processing circuitry 131 generates second phase correction data based on the second average data.

(Step Sb6)

With the image generation function 1313, the processing circuitry 131 performs phase correction on each of the first MR data and the first average data by using the first phase correction data. The processing circuitry 131 performs phase correction on each of the second MR data and the second average data by using the second phase correction data. The phase correction in the processing of this step cancels the phase error in each of the first MR data, the second MR data, the first average data, and the second average data.

(Step Sb7)

With the image generation function 1313, the processing circuitry 131 removes phase information from the phase-corrected first MR data by using the phase-corrected first average data. The processing circuitry 131 removes phase information from the phase-corrected second MR data by using the phase-corrected second average data. Specifically, the processing circuitry 131 calculates first phase information by using the real component and imaginary component of the phase-corrected first average data. Then, the processing circuitry 131 removes the first phase information from the phase-corrected first MR data. The processing circuitry 131 calculates second phase information by using the real component and imaginary component of the phase-corrected second average data. Then, the processing circuitry 131 removes the second phase information from the phase-corrected second MR data. The subsequent processing is the same as the processing of step Sa6 in FIG. 3, and descriptions thereof will be omitted. In the processing of step Sa6 subsequent to this step Sb7, the processing circuitry 131 may perform correction to address uneven sensitivity of the receiver coil 117 on the first real image and the second real image by using the sensitivity map of the receiver coil 117. The processing from step Sb1 to step Sb7 and the processing of step Sa6 subsequent to step Sb7 may be repeated as appropriate. The processing from step Sb1 to step Sb7 and the processing of step Sa6 subsequent to step Sb7 may be repeated as appropriate until a plurality of real images corresponding to a plurality of slices required by the operator can be obtained at the imaging target site.

The above-described configuration has the following advantages:

The MRI apparatus 100 according to the present embodiment can execute, in a first cardiac cycle CC1, a first sequence S1 for applying a first IR pulse IR1 to a first slice SL1, collecting second reference data from the second slice SL2 after application of the first IR pulse IR1 and immediately before collection of first MR data, collecting the first MR data, applying a first spoiler pulse Sp1 to the first slice SL1 after collection of the first MR data, and collecting again second reference data from the second slice SL2 after application of the first spoiler pulse Sp1. The present MRI apparatus 100 can also execute, in a second cardiac cycle CC2, a second sequence S2 for applying a second IR pulse IR2 to the second slice SL2, collecting first reference data from the first slice SL1 after application of the second IR pulse IR2 and immediately before collection of second MR data, collecting the second MR data, applying a second spoiler pulse Sp2 to the second slice SL2 after collection of the second MR data, and collecting again first reference data from the first slice SL1 after application of the second spoiler pulse Sp2.

Moreover, the present MRI apparatus 100 can collect first MR data in the first cardiac cycle CC1 by excitation of a first region Re1 including the first slice SL1, and can collect reference data used for phase correction of second MR data on the second slice SL2 not included in the first region Re1 before and after collection of the first MR data in the same first cardiac cycle CC1. Furthermore, the present MRI apparatus 100 can collect second MR data in the second cardiac cycle CC2 that is different from the first cardiac cycle CC1 by excitation of a second region Re2 including the second slice SL2, and can phase-correct the second MR data obtained in the second cardiac cycle CC2 by using the reference data.

As described above, the MRI apparatus 100 in the present embodiment can reduce the imaging time in imaging by the PSIR method. In addition, the present MRI apparatus 100 can phase-correct the first MR data by using first average data near the time phase of the first collection sequence M1, and can phase-correct the second MR data by using second average data near the time phase of the second collection sequence M2, and thus can improve the accuracy of phase correction and improve image quality of real images.

As a modification of the present embodiment, it is possible to apply the first IR pulse IR1 and the first spoiler pulse Sp1 to the first region Re1, and apply the second IR pulse IR2 and the second spoiler pulse Sp2 to the second region Re2, as in the first embodiment. As a further modification of the present embodiment, multiband imaging may be applied as in the application of the first embodiment. The processing and advantages of those modifications are the same as those of the first embodiment and the application of the first embodiment, and descriptions thereof will be omitted.

Third Embodiment

Figure 8:
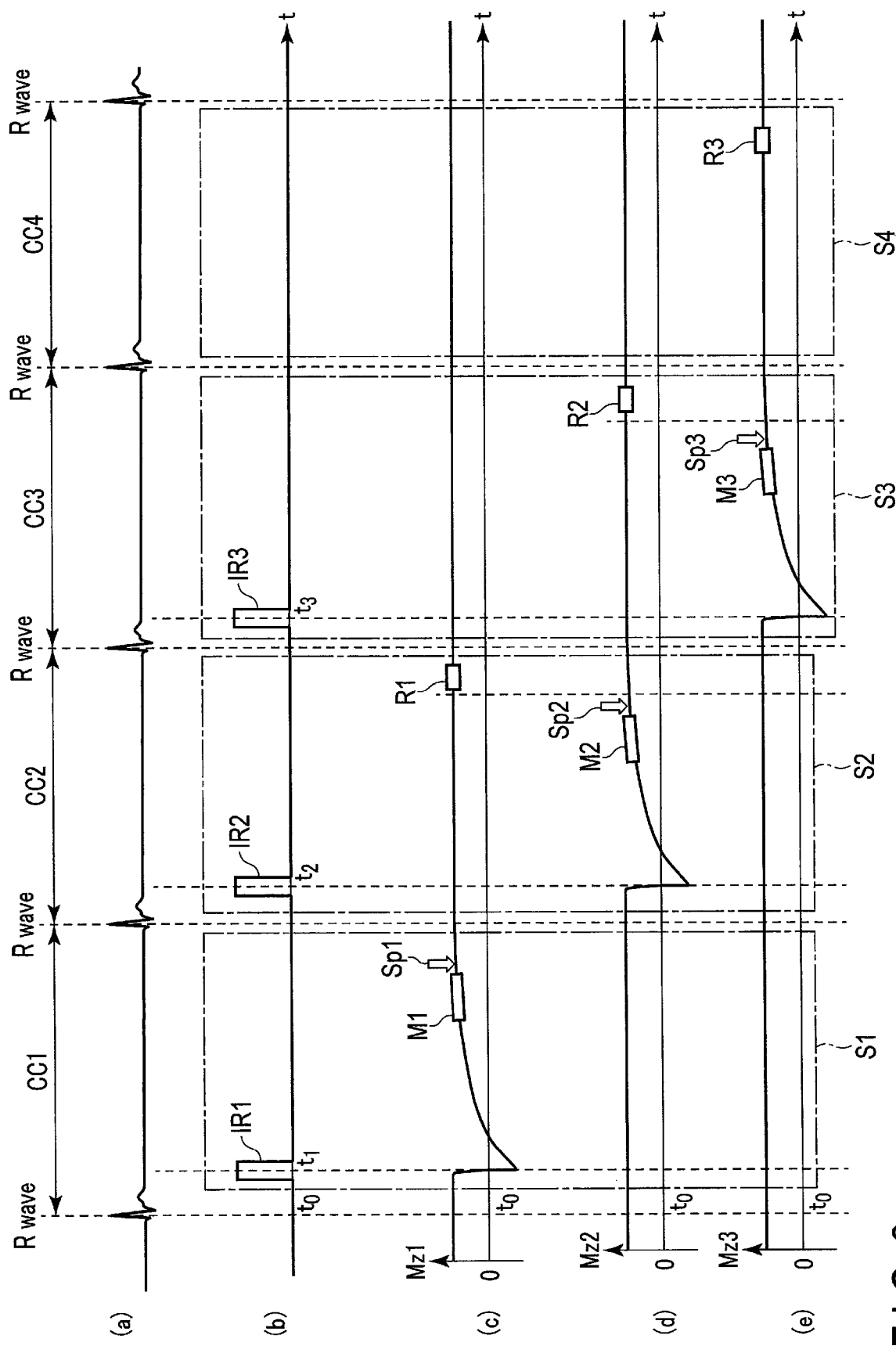
FIG. 8 is a diagram showing an example of the sequences of the PSIR method performed in the third embodiment.

The third embodiment differs from the first embodiment, the application, and the second embodiment in that collection of MR data and collection of reference data are shifted for every cardiac cycle and slice as shown in FIG. 8. FIG. 8 is a diagram showing an example of the sequences of the PSIR method executed in the present embodiment. (a) in FIG. 8 shows an electrocardiographic waveform of the subject P obtained by an electrocardiograph. (b) in FIG. 8 shows the timing of application of the first IR pulse IR1 and the second IR pulse IR2 to the subject P. (c) in FIG. 8 shows a temporal change of longitudinal magnetization Mz1 in the first slice SL1. (d) in FIG. 8 shows a temporal change of longitudinal magnetization Mz2 in the second slice SL2. (e) in FIG. 8 shows a temporal change of longitudinal magnetization Mz3 in a third slice apart from the first slice SL1 and the second slice SL2.

As shown in FIG. 8, the first sequence S1 includes a first IR pulse IR1, a first collection sequence M1, and a first spoiler pulse Sp1. The second sequence S2 includes a second IR pulse IR2, a second collection sequence M2, a second spoiler pulse Sp2, and a first reference collection sequence R1. The third sequence S3 includes a third IR pulse IR3, a third collection sequence M3, a third spoiler pulse Spa, and a second reference collection sequence R2. The fourth sequence S4 includes a third reference collection sequence R3.

Descriptions will be provided assuming that the number of slices to be imaged in the present embodiment is three as shown in FIG. 8; however, the number of slices is not limited to this number. The first IR pulse IR1 and the first spoiler pulse Sp1 in the present embodiment are selectively applied to the first slice SL1 as in the second embodiment. The second IR pulse IR2 and the second spoiler pulse Sp2 in the present embodiment are selectively applied to the second slice SL2 as in the second embodiment.

The third IR pulse IR3 is an RF pulse that inverts nuclear magnetization in the third slice. The third IR pulse IR3 is selectively applied to the third slice at time $t_3$, which is the predetermined time after an R wave in a third cardiac cycle CC3.

The third collection sequence M3 is a sequence for collecting MR data for an image relating to the third slice (hereinafter referred to as third MR data) after application of the third IR pulse IR3 in the third cardiac cycle CC3. The third collection sequence M3 is the same as the first and second collection sequences M1 and M2 other than the cardiac cycle and the slice position.

The third spoiler pulse Sp3 is a spoiler pulse that recovers nuclear magnetization in the third slice. After execution of the third collection sequence M3 in the third cardiac cycle CC3, the third spoiler pulse Sp3 is selectively applied to the third slice. The third spoiler pulse Sp3 is the same as the first spoiler pulse Sp1 and the second spoiler pulse Sp2 other than the cardiac cycle and the application region.

The first to third reference collection sequences R1, R2, and R3 in the present embodiment are executed by using a second flip angle that is equal to or larger than the flip angle in the first and second collection sequences M1 and M2 (hereinafter referred to as a first flip angle). For example, the second flip angle used in the first to third reference collection sequences R1, R2, and R3 is set to be larger than the flip angle in the first and second reference collection sequences in the first embodiment and the second embodiment. The first flip angle is stored in the storage apparatus 129 together with the first to third sequences S1, S2, and S3, and the second flip angle is stored in the storage apparatus 129 together with the second to fourth sequences S2, S3, and S4.

The second reference collection sequence R2 is a sequence for collecting second reference data from the second slice after application of the third spoiler pulse Spa in the third cardiac cycle CC3. The second reference collection sequence R2 is the same as the first reference collection sequence R1 other than the cardiac cycle and the slice position.

The third reference collection sequence R3 is a sequence for collecting reference data from the third slice (hereinafter referred to as third reference data) by using the second flip angle, in a cardiac phase of a fourth cardiac cycle CC4, which is subsequent to the third cardiac cycle CC3, immediately after application of the spoiler pulses (the first to third spoiler pulses). The third reference data is used for phase correction of the third MR data. The third reference collection sequence R3 is the same as the first and second reference collection sequences R1 and R2 other than the cardiac cycle and the slice position.

(Operation)

Figure 9:
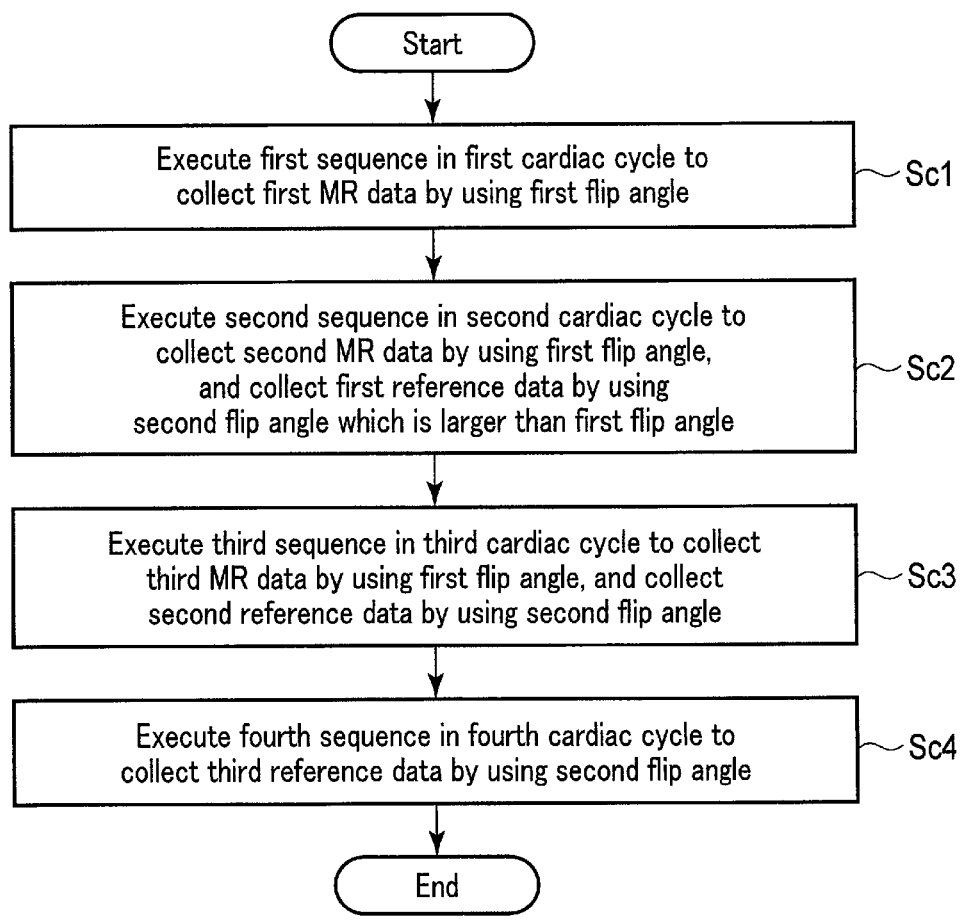
FIG. 9 is a diagram showing an example of the steps of the operation in the third embodiment.

The steps of the operation in the present embodiment will be described with reference to FIGS. 8 and 9. FIG. 9 is a diagram showing an example of the steps of the operation in the present embodiment. In the description of the operation, the processing different from that in the first embodiment will be described.

(Step Sc1)

The sequence control circuitry 121 executes the first sequence S1 in the first cardiac cycle CC1 to collect first MR data by using the first flip angle after application of the first IR pulse IR1 to the first slice SL1. The sequence control circuitry 121 outputs the first MR data to the processing circuitry 131.

(Step Sc2)

The sequence control circuitry 121 executes the second sequence S2 in the second cardiac cycle CC2 to collect second MR data by using the first flip angle, and to collect first reference data by using the second flip angle that is larger than the first flip angle. The sequence control circuitry 121 outputs the second MR data and the first reference data to the processing circuitry 131.

(Step Sc3)

The sequence control circuitry 121 executes the third sequence S3 in the third cardiac cycle CC3 to collect third MR data by using the first flip angle, and to collect second reference data by using the second flip angle. Specifically, as shown in FIG. 8, the sequence control circuitry 121 controls the transmission circuitry 113 to apply the third IR pulse IR3 to the third slice at time $t_3$, which is the predetermined time after the detection time of the first R wave in the third cardiac cycle CC3 (or the last R wave in the second cardiac cycle CC2).

As shown in (d) of FIG. 8, the sequence control circuitry 121 executes the third collection sequence M3 in an approximate diastolic phase of the third cardiac cycle CC3, and collects third MR data on the third slice. After collection of the third MR data, the sequence control circuitry 121 controls the transmission circuitry 113 and/or the gradient magnetic field power supply 105 to apply the third spoiler pulse Sp3 to the third slice. After application of the third spoiler pulse Sp3, the sequence control circuitry 121 executes the second reference collection sequence R2, and collects second reference data. The sequence control circuitry 121 outputs the third MR data and the second reference data to the processing circuitry 131.

(Step Sc4)

The sequence control circuitry 121 executes the fourth sequence S4 in the fourth cardiac cycle CC4 to collect third reference data by using the second flip angle. Specifically, the sequence control circuitry 121 executes the third reference collection sequence R3 in a cardiac phase of the fourth cardiac cycle CC4 immediately after application of the first to third spoiler pulses (Sp1, Sp2, and Sp3), and collects third reference data. The sequence control circuitry 121 outputs the third reference data to the processing circuitry 131.

With the image generation function 1313, the processing circuitry 131 performs the processing from step Sa3 to step Sa6 in FIG. 3 on each of the first slice SL1, the second slice SL2, and the third slice, and generates a real image of the first slice SL1, the second slice SL2, and the third slice.

The processing from step Sc1 to step Sc4 and processing for generating a real image of each slice may be repeated as appropriate. At this time, the fourth sequence S4 may be incorporated into the first sequence S1. The processing from step Sc1 to step Sc4 and processing for generating a real image of each slice may be repeated as appropriate until a plurality of real images corresponding to a plurality of slices required by the operator can be obtained at the imaging target site. At this time, an IR pulse, collection sequence, and spoiler pulse relating to a slice different from the first to third slices may be incorporated into the fourth sequence S4.

The above-described configuration has the following advantages:

The MRI apparatus 100 according to the present embodiment can execute, in a first cardiac cycle CC1, a first sequence S1 for applying a first IR pulse IR1 to a first slice SL1, collecting first MR data on the first slice SL1 by using a first flip angle after application of the first IR pulse IR1, and applying a first spoiler pulse Sp1 to the first slice SL1 after collection of the first MR data. The present MRI apparatus 100 can also execute, in a second cardiac cycle CC2, a second sequence S2 for applying a second IR pulse IR2 to a second slice SL2, collecting second MR data by using the first flip angle after application of the second IR pulse IR2, applying a second spoiler pulse Sp2 to the second slice SL2 after collection of the second MR data, and collecting first reference data by using a second flip angle after application of the second spoiler pulse Sp2. Furthermore, the present MRI apparatus 100 can execute, in a third cardiac cycle CC3, a third sequence S3 for applying a third IR pulse IR3 to a third slice, collecting third MR data by using the first flip angle after application of the third IR pulse IR3, applying a third spoiler pulse Sp3 to the third slice after collection of the third MR data, and collecting second reference data by using the second flip angle after application of the third spoiler pulse Sp3. Moreover, the present MRI apparatus 100 can execute a fourth sequence S4 for collecting third reference data by using the second flip angle, in a cardiac phase of the fourth cardiac cycle CC4 immediately after application of the third spoiler pulse Sp3.

As described above, the MRI apparatus 100 in the present embodiment can reduce the imaging time in imaging by the PSIR method. In addition, according to the present MRI apparatus 100, when the processing from step Sc1 to step Sc4 and processing for generating a real image of each slice are repeated, a time interval corresponding to approximately one heartbeat can be provided between an MR data collection sequence and a reference collection sequence for each slice. Consequently, longitudinal magnetization immediately after execution of a reference collection sequence can be recovered to regain the thermal equilibrium state. Therefore, the present MRI apparatus 100 can collect the first to third reference data by using a second flip angle that is equal to or larger than the first flip angle, for example, a second flip angle larger than the flip angle in the first and second embodiments, in the first to third reference collection sequences R1, R2, and R3. The SNR of an MR image is larger when the flip angle is larger. Therefore, the MRI apparatus 100 of the present embodiment can improve the SNR of the first to third phase correction data used for phase correction. Accordingly the present MRI apparatus 100 can improve the accuracy of phase correction and improve the image quality of real images.

As a modification of the present embodiment, it is possible to apply the first IR pulse IR1 and the first spoiler pulse Sp1 to the first region Re1, apply the second IR pulse IR2 and the second spoiler pulse Sp2 to the second region Re2, and apply the third IR pulse IR3 and the third spoiler pulse Sp3 to a third region different from the first region Re1 and the second region Re2 and including the third slice, as in the first embodiment. In addition, when four slices are to be imaged, of the regions respectively including the slices, two regions sandwiching another region therebetween may be sequentially applied with an IR pulse to collect MR data, to avoid interference between IR pulses applied to adjacent regions. As a further modification of the present embodiment, multiband imaging may be applied to the present embodiment as in the modification of the first embodiment.

As a further modification of the present embodiment, it is possible to further collect first reference data from the first slice SL1 immediately before collection of second MR data, further collect second reference data from the second slice SL2 immediately before collection of third MR data, and further collect third reference data from the third slice in a cardiac phase of the fourth cardiac cycle CC4 immediately before collection of the third MR data, as in the second embodiment. The processing and advantages of those modifications are the same as those of the first embodiment, the application of the first embodiment, and the second embodiment, and descriptions thereof will be omitted.

As a modification of the first and second embodiments, a spoiler pulse may be applied immediately after a reference collection sequence. In this case, in any of the embodiments and modifications and the like, it is possible to make the second flip angle equal to or larger than the first flip angle, and to improve the accuracy of phase correction and improve the image quality of real images.

The MRI apparatus 100 in the embodiments and at least one modification or the like as described above can reduce the imaging time in imaging by the PSIR method.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A magnetic resonance imaging apparatus, comprising:
sequence control circuitry that collects first MR data by excitation of a first region including a first slice, and collects reference data used for phase correction of second MR data on a second slice not included in the first region before and after collection of the first MR data,
wherein the sequence control circuitry collects the first MR data and the reference data in a first cardiac cycle.

2. The magnetic resonance imaging apparatus according to claim 1, wherein
the sequence control circuitry collects the second MR data in a second cardiac cycle that is different from the first cardiac cycle by excitation of a second region including the second slice, and the magnetic resonance imaging apparatus further comprises processing circuitry that phase-corrects the second MR data obtained in the second cardiac cycle by using the reference data.

3. A magnetic resonance imaging apparatus, comprising:
sequence control circuitry that collects first MR data in a first cardiac cycle by excitation of a first region including a first slice, and collects reference data used for phase correction of second MR data on a second slice not included in the first region before and after collection of the first MR data in the first cardiac cycle, wherein
in the first cardiac cycle, the sequence control circuitry applies an IR pulse to the first region before collection of the reference data, applies a recovery pulse for recovery of nuclear magnetization to the first region after correction of the first MR data, and collects the reference data after application of the recovery pulse.

4. The magnetic resonance imaging apparatus according to claim 1, wherein
the first slice has a thickness corresponding to a plurality of slices,
the second slice has a thickness corresponding to a plurality of slices, and
the sequence control circuitry
applies an RF pulse in a multi-frequency band corresponding to the first slice to the first slice when the first MR data is collected, and
applies an RF pulse in a multi-frequency band corresponding to the second slice to the second slice when the reference data is collected.

5. The magnetic resonance imaging apparatus according to claim 1, further comprising:
processing circuitry that generates average data by performing averaging processing on the reference data collected before and after collection of the first MR data, and generates a real image by performing phase correction on the first MR data by using the average data.

6. A magnetic resonance imaging method, comprising:
collecting first MR data by excitation of a first region including a first slice and,
collecting reference data used for phase correction of second MR data on a second slice not included in the first region before and after collection of the first MR data,
wherein the first MR data and the reference data are collected in a first cardiac cycle.

7. The magnetic resonance imaging method according to claim 6, further comprising:
collecting the second MR data in a second cardiac cycle that is different from the first cardiac cycle by excitation of a second region including the second slice, and
phase-correcting the second MR data obtained in the second cardiac cycle by using the reference data.

8. The magnetic resonance imaging method according to claim 6, further comprising
in the first cardiac cycle, applying an IR pulse to the first region before collection of the reference data, applying a recovery pulse for recovery of nuclear magnetization to the first region after correction of the first MR data, and collecting the reference data after application of the recovery pulse.

9. The magnetic resonance imaging method according to claim 6, wherein
the first slice has a thickness corresponding to a plurality of slices, the second slice has a thickness corresponding to a plurality of slices, and the magnetic resonance imaging method further comprises:

applying an RF pulse in a multi-frequency band corresponding to the first slice to the first slice when the first MR data is collected, and applying an RF pulse in a multi-frequency band corresponding to the second slice to the second slice when the reference data is collected.

10. The magnetic resonance imaging method according to claim 6, further comprising generating average data by performing averaging processing on the reference data collected before and after collection of the first MR data, and generating a real image by performing phase correction on the first MR data by using the average data.

\* \* \* \* \*